(12) United States Patent
Lee

(10) Patent No.: US 7,875,880 B2
(45) Date of Patent: Jan. 25, 2011

(54) LIGHT EMITTING DISPLAY DEVICE HAVING A DUMMY PIXEL AND METHOD FOR FABRICATING THE SAME

(75) Inventor: Hong-ro Lee, Suwon-si (KR)

(73) Assignee: Samsung Mobile Display Co., Ltd., Suwon-si, Gyeonggi-do (KR)

( * ) Notice: Subject to any disclaimer, the term of this patent is extended or adjusted under 35 U.S.C. 154(b) by 302 days.

(21) Appl. No.: 12/036,144

(22) Filed: Feb. 22, 2008

(65) Prior Publication Data

US 2008/0283836 A1 Nov. 20, 2008

(30) Foreign Application Priority Data

May 15, 2007 (KR) .................. 10-2007-0047095

(51) Int. Cl.
*G09G 3/10* (2006.01)
(52) U.S. Cl. ............... 257/40; 257/E51.019; 315/169.3
(58) Field of Classification Search .............. 257/40, 257/607, E51.019; 315/169.3
See application file for complete search history.

(56) References Cited

U.S. PATENT DOCUMENTS

2005/0001247 A1* 1/2005 Ozawa et al. .............. 257/291

FOREIGN PATENT DOCUMENTS

| JP | 2002207223 | 7/2002 |
|---|---|---|
| JP | 2004-103488 | 4/2004 |
| KR | 1019980068791 | 10/1998 |
| KR | 1020020093391 | 12/2002 |
| KR | 10-2003-0095765 | 12/2003 |
| KR | 1020040009866 | 1/2004 |
| KR | 10-2005-0098596 | 10/2005 |
| KR | 10-2006-0078238 | 7/2006 |

* cited by examiner

*Primary Examiner*—Thomas L Dickey
(74) *Attorney, Agent, or Firm*—Knobbe, Martens, Olson & Bear, LLP

(57) ABSTRACT

Disclosed are a light emitting display and a method for fabricating the same. The light emitting display includes a substrate. A thin film transistor is formed on a first region of the substrate, and includes a semiconductor layer, a gate electrode, and source/drain electrodes. An organic light emitting diode is electrically coupled to the thin film transistor and includes a first electrode, an emission layer, and a second electrode. A dummy pixel, formed in a second region of the substrate, includes at least one dummy pattern. The dummy pattern is formed of the same material as that of one of the semiconductor layer, the gate electrode, the source/drain electrodes, and the first electrode.

7 Claims, 4 Drawing Sheets

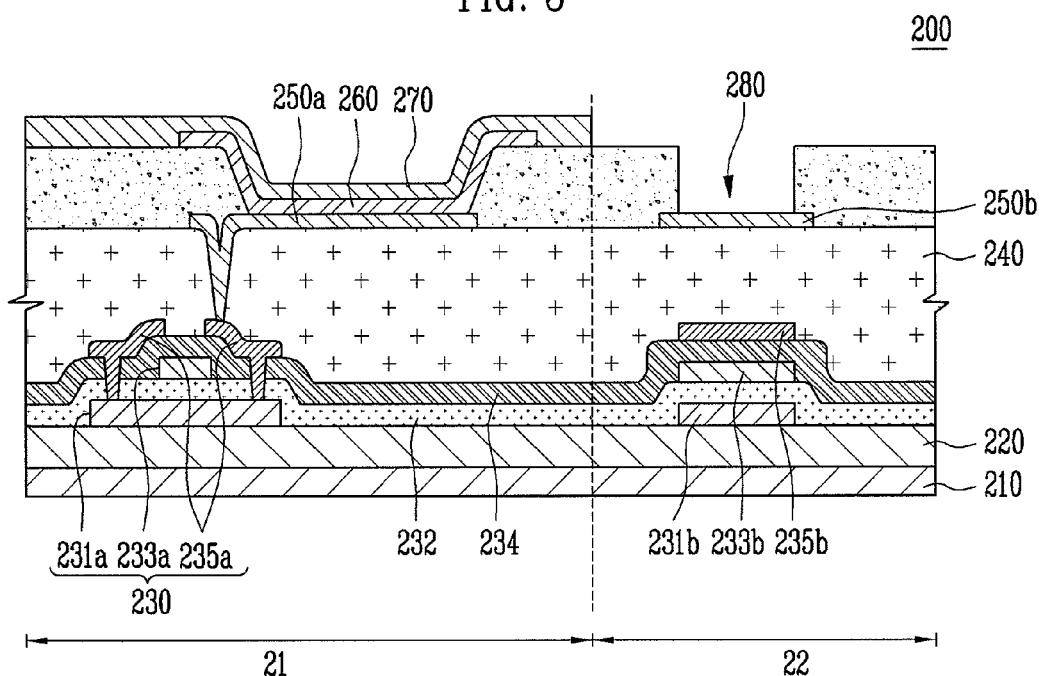
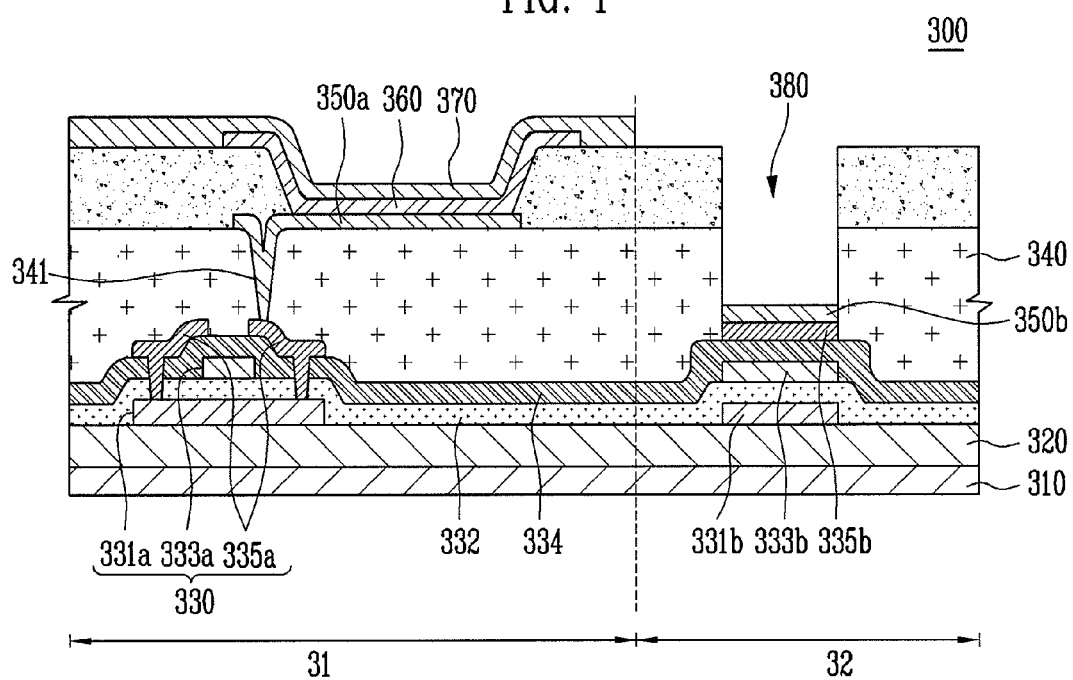

LIGHT EMITTING DISPLAY DEVICE HAVING A DUMMY PIXEL AND METHOD FOR FABRICATING THE SAME

CROSS-REFERENCE TO RELATED APPLICATIONS

This application claims the benefit of Korean Patent Application No. 10-2007-0047095, filed on May 15, 2007 in the Korean Intellectual Property Office, the disclosure of which is incorporated herein by reference.

BACKGROUND

1. Technical Field

This disclosure relates to a light emitting display and a method for fabricating the same, and more particularly, to a light emitting display including a pattern useful for analyzing causes for defects in a thin film formed on a substrate, and a method for fabricating the same.

2. Discussion of Related Art

Organic light emitting displays, which have been widely used, have relatively simple structures. An organic light emitting display is also called an organic electroluminescence display device, which is an emissive display using an organic film layer as an emission layer. Unlike a liquid crystal display, a back light is not required, thereby reducing thickness and weight. Accordingly, organic light emitting displays have been actively developed as display panels for portable information terminals such as mobile computers, portable telephones, portable game devices, or electronic books.

In determining the causes of defects associated with driving the organic light emitting display and/or analyzing the characteristics of a device, many types of signals provided thereto are measured. Such signals are typically measured using a measuring tip. In a typical organic light emitting display, of the electrodes to which signals are provided, only the cathodes are exposed. The remaining electrodes, that is, the gate electrodes, source/drain electrodes, and anodes are covered by an insulating layer. Accordingly, to probe signals provided to the gate electrode, the source/drain electrodes, and the anode using a measuring tip, the insulating layer formed thereover is decapped to expose at least one of the electrodes.

However, in the signal measuring method as described above, thin films formed on the substrate are removed. During the removal of a thin film, a part of the thin film is damaged, so that it is difficult to determine the electrical characteristics of the thin film.

In another method for measuring signals of a thin film transistor formed in a pixel region, a test pattern is formed in a non-pixel region. Prior to encapsulating a substrate on which the thin film transistor is formed, defects in the thin film transistor are tested based on the test pattern.

However, the test pattern provides only a result as to whether or not the thin film transistor formed on the substrate has electrical characteristics different from desired electrical characteristics. It is difficult to determine the fundamental causes as to which of the thin films formed on the substrate causes a defect and what defects occur in the thin film.

SUMMARY OF THE INVENTION

Accordingly, it is an object is to provide a light emitting display useful for analyzing causes of defects in a thin film formed on a substrate without damaging the thin film, and a method for fabricating the same.

The foregoing and/or other objects are achieved by providing a light emitting display device comprising: a substrate; a thin film transistor formed on a first region of the substrate, and including a semiconductor layer, a gate electrode, and source/drain electrodes; an organic light emitting diode electrically coupled to the thin film transistor and including a first electrode, an emission layer, and a second electrode; and a dummy pixel including at least one dummy pattern in a second region of the substrate, which is formed of the same material as one of the semiconductor layer, the gate electrode, the source/drain electrodes, and the first electrode.

Preferably, the dummy pixel includes a dummy pattern, and one surface of the dummy pattern is exposed through an opening. More preferably, the exposed dummy pattern is formed of the same material as the semiconductor layer. Most preferably, the exposed dummy pattern is formed of the same material as the gate electrode, and/or the exposed dummy pattern is formed of the same material as the source/drain electrodes.

Also, in some embodiments, the exposed dummy pattern is formed of the same material as the first electrode. Furthermore, a plurality of dummy pixels is formed, and one surface of each of the dummy patterns is exposed through each opening. Moreover, a test pattern is formed on a third region of the substrate, which is used in testing electrical characteristics of the thin film transistor.

According to another aspect, there is provided a method of manufacturing a light emitting display device, comprising the steps of: (a) forming a semiconductor layer on a first region of a substrate; (b) forming a first insulating layer on the semiconductor layer; (c) forming a first electrode on the first insulating layer; (d) forming a second electrode on the first electrode; (e) removing parts of the first and second insulating layers to expose a part of the semiconductor layer; (f) forming a second electrode on the second insulating layer; (g) forming a third insulating layer on the second electrode; (h) removing a part of the third insulating layer to expose a part of the second electrode; (i) forming a third electrode on the third insulating layer; (j) forming a fourth insulating layer on the third electrode; (k) removing a part of the fourth insulating layer to expose a part of the third electrode; (l) forming an emission layer on the exposed part of the third electrode; and (m) forming a fourth electrode on the emission layer, and wherein the method further comprises at least one step of: (n) forming and exposing a first dummy pattern on a second region of the substrate in step (a), the first dummy pattern being formed of the same material as that of the semiconductor layer; (o) forming and exposing a second dummy pattern on a third region of the substrate in step (c), the second dummy pattern being formed of the same material as that of the first electrode; (p) forming and exposing a third dummy pattern on a fourth region of the substrate in step (f), the third dummy pattern being formed of the same material as that of the second electrode; and (q) forming and exposing a fourth dummy pattern on a fourth region of the substrate in step (i), the fourth dummy pattern being formed of the same material as that of the third electrode.

Preferably, the method further comprises forming a mask at an upper portion of the first, second, third, or fourth dummy pattern after at least one of steps (n) to (q). More preferably, step (n) comprises removing at least one of the first, second, third, and fourth insulating layers, which are formed at an upper portion of the first dummy pattern. Most preferably, step (o) comprises removing at least one of the second, third, and fourth insulating layers, which are formed at an upper portion of the second dummy pattern. Also, step (p) comprises removing at least one of the second, third, and fourth insulating layers, which are formed at an upper portion of the third dummy pattern. Furthermore, step (q) comprises removing the fourth insulating layer, which is formed at an upper portion of the fourth dummy pattern.

Some embodiments provide a light emitting display device, comprising: a substrate; a thin film transistor formed on a first region of the substrate, and including a semiconductor layer, a gate electrode, and source/drain electrodes; an organic light emitting diode electrically coupled to the thin film transistor and including a first electrode, an emission layer, and a second electrode; and a dummy pixel including at least one dummy pattern, wherein the dummy pixel is formed in a second region of the substrate, and the at least one dummy pattern is formed of the same material as one of the semiconductor layer, the gate electrode, the source/drain electrodes, and the first electrode.

In some embodiments, the dummy pixel includes a dummy pattern, and one surface of the dummy pattern is exposed through an opening. In some embodiments, the exposed surface of the dummy pattern is formed of the same material as the semiconductor layer. In some embodiments, the exposed surface of the dummy pattern is formed of the same material as the gate electrode. In some embodiments, the exposed surface of the dummy pattern is formed of the same material as the source/drain electrodes. In some embodiments, the exposed surface of the dummy pattern is formed of the same material as the first electrode.

Some embodiments comprise a plurality of dummy pixels, wherein one surface of each dummy pattern is exposed through a respective opening.

In some embodiments, a test pattern is formed on a third region of the substrate, configured for testing an electrical characteristic of the thin film transistor.

Some embodiments provide a method of manufacturing a light emitting display device comprising: (a) forming a semiconductor layer on a first region of a substrate; (b) forming a first insulating layer on the semiconductor layer; (c) forming a first electrode on the first insulating layer; (d) forming a second insulating layer on the first electrode; (e) exposing a portion of the semiconductor layer through the first and second insulating layers; (f) forming a second electrode on the second insulating layer and exposed portion of the semiconductor layer; (g) forming a third insulating layer on the second electrode; (h) exposing a portion of the second electrode through the third insulating layer; (i) forming a third electrode on the third insulating layer and exposed portion of the second electrode; (j) forming a fourth insulating layer on the third electrode; (k) exposing a portion of the third electrode through the fourth insulating layer; (l) forming an emission layer on the exposed portion of the third electrode; and (m) forming a fourth electrode on the emission layer. The method further comprises at least one of: (n) forming and exposing a first dummy pattern on a second region of the substrate in step (a), wherein the first dummy pattern is formed of the same material as the semiconductor layer; (o) forming and exposing a second dummy pattern on a second region of the substrate in step (c), wherein the second dummy pattern is formed of the same material as that of the first electrode; (p) forming and exposing a third dummy pattern on a second region of the substrate in step (f), wherein the third dummy pattern is formed of the same material as that of the second electrode; and (q) forming and exposing a fourth dummy pattern on a second region of the substrate in step (i), wherein the fourth dummy pattern is formed of the same material as that of the third electrode.

Some embodiments further comprise forming a mask over the first, second, third, or fourth dummy pattern after forming in one of steps (n) to (q).

In some embodiments, step (n) comprises removing portions of at least one of the first, second, third, and fourth insulating layers formed over the first dummy pattern. In some embodiments, step (o) comprises removing portions of at least one of the second, third, and fourth insulating layers formed over the second dummy pattern. In some embodiments, step (p) comprises removing portions of at least one of the second, third, and fourth insulating layers formed over the third dummy pattern. In some embodiments, step (q) comprises removing a portion of the fourth insulating layer formed over the fourth dummy pattern.

BRIEF DESCRIPTION OF THE DRAWINGS

These and/or other aspects and advantages will become apparent and more readily appreciated from the following description of certain preferred embodiments, taken in conjunction with the accompanying drawings of which:

FIG. 3 is a cross-sectional view showing an organic light emitting display according to a second embodiment;

FIG. 4 is a cross-sectional view showing an organic light emitting display according to a third embodiment.

DETAILED DESCRIPTION OF CERTAIN EMBODIMENTS

Figure 1:
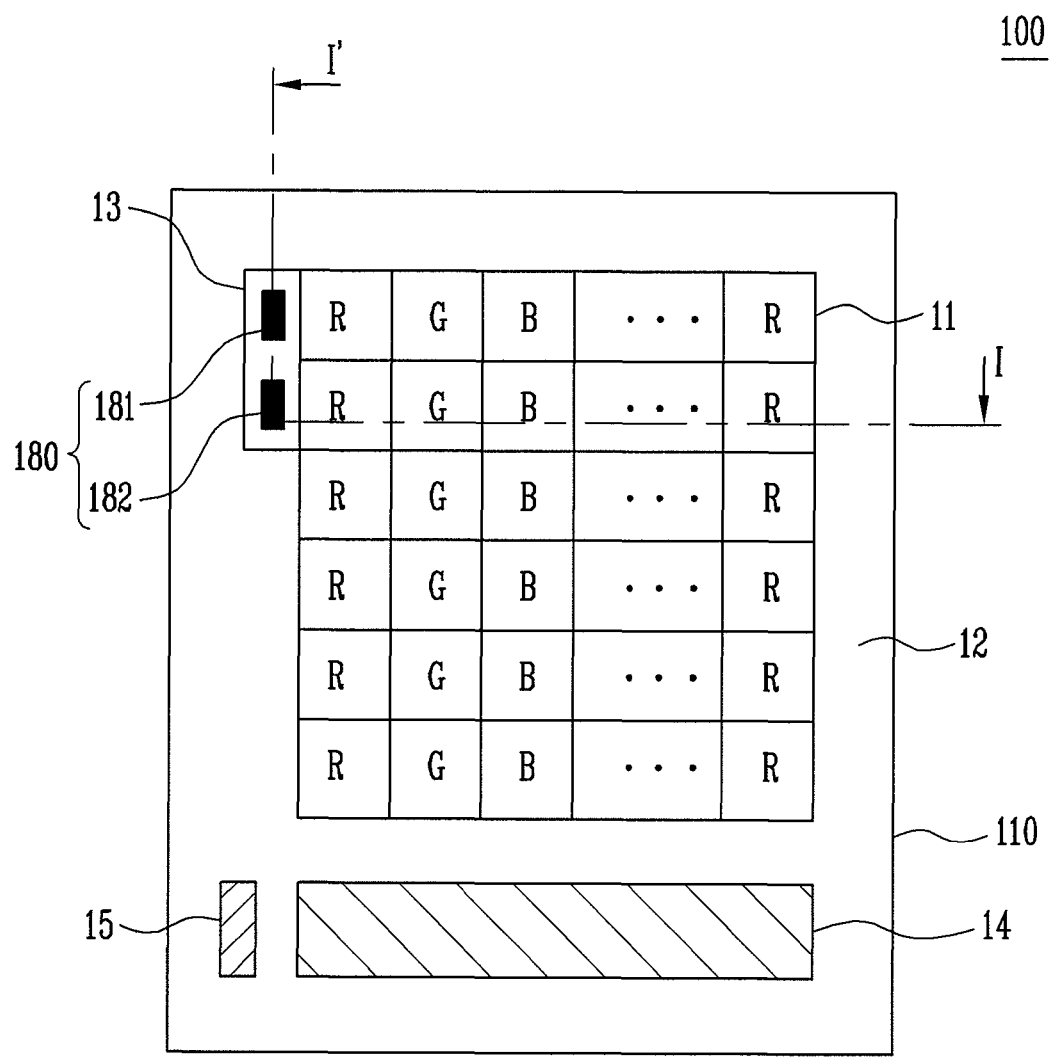
FIG. 1 is a top view showing an organic light emitting display according to a first embodiment.

Hereinafter, exemplary embodiments will be described with reference to the accompanying drawings. Here, when a first element is coupled to a second element, the first element may be directly coupled to the second element and also indirectly coupled to the second element through one or more other elements. Further, irrelevant elements are omitted for clarity. Also, like reference numerals refer to like elements throughout.

FIG. 1 is a plan view showing an organic light emitting display 100 according to a first embodiment. With reference to FIG. 1, the organic light emitting display 100 includes a substrate 110, a thin film transistor, and an organic light emitting diode.

The thin film transistor is formed on a first region of the substrate 110, and includes a semiconductor layer, a gate electrode, and source/drain electrodes. The organic light emitting diode is electrically coupled to the thin film transistor, and includes a first electrode, an emission layer, and a second electrode. The organic light emitting display 100 further includes a dummy pixel 13. The dummy pixel 13 is formed on a second region of the substrate, and includes at least one dummy pattern, which is formed of the same material as one of the semiconductor layer, the gate electrode, the source/drain electrodes, and the first electrode.

The substrate 110 comprises a first region 11, being a pixel region, and a second region 12, being a non-pixel region. A scan line, a data line, and an organic light emitting diode are formed on the first region 11 of the substrate 10. The organic light emitting diode is coupled between the scan line and the data line, and constitutes a pixel. The organic light emitting diode includes a first electrode layer, an emission layer, and a second electrode layer. When a predetermined voltage is applied to the first electrode layer and the second electrode layer, holes injected through the first electrode layer and electrons injected through the second electrode layer are recombined in the emission layer to emit light.

A scan line, a data line, a power supply line for operating the organic light emitting diode, a scan driver, and a data driver are formed on the second region 12. The scan line and the data line extend from the scan line and the data line of the first region 11. The scan driver and the data driver process external signals provided through a pad portion 14, and supply the processed signals to the scan line and the data line, respectively. The pad portion 14 is coupled to a flexible printed circuit (FPC) in a form of a film. Signals are supplied through the FPC to the scan driver, thereby operating the organic light emitting diode.

In the illustrated embodiment, the dummy pixel 13 includes at least one dummy pattern, which is formed peripherally to the first region 11, that is, in the second region 12. Here, a plurality of pixels is arranged on the first region 11. At least one dummy pattern has the same thin film as the pixel, which is formed on the first region 11. Furthermore, at least one dummy pixel 13 is formed on the second region 12, and may include different dummy patterns exposing different thin films.

For example, the dummy pixel 13 may be formed at the semiconductor layer, the gate electrode, and the source/drain electrode of the first region 11, or the second region 12. The dummy pixel 13 is formed of the same material as one of the semiconductor layer, the gate electrode, the source/drain electrodes, and the first electrode using the same process. When the emission layer and the second electrode of the organic light emitting diode on the second region 11 are formed, a mask is arranged on the dummy pixel 13 formed on the second region 12 in order to prevent the emission layer and the second electrode layer from being formed on the dummy pixel 13.

Furthermore, a test pattern 15 can be formed on a third region. Here, the test pattern 15 functions to test signals applied to the thin film transistor formed on the first region 11. The third region is a region of the non-pixel region 12 of the substrate 110. Prior to encapsulating the substrate 110 on which the thin film transistor and the organic light emitting diode are formed, the test pattern 15 is used to determining the quality of the thin film transistor. The test pattern 15 tests defects in the thin film transistor by apply a predetermined signal to the thin film transistor.

When there are defects in the thin film transistor, point or line defects occur in the images of the display, or the images are not formed. As described above, when a defect occur in an image, a cause of the defect may be determined using the dummy pixel 13 formed on the second region 12, which has the same thin film as the first region 11. Furthermore, an upper portion of the thin film formed on the second region 12 may be exposed by etching using a focused ion beam (FIB). However, when the FIB is used, ions may be deposited on the exposed thin film or a surface of the thin film may be damaged in removing a part of the thin film.

In some embodiments, an insulating film formed on the first region 11 is etched. Thus, when a contact hole, a via hole, or an opening portion of a pixel defining layer is formed, the dummy pixel 13 region is simultaneously etched to expose the thin film. Moreover, in the dummy pixel 13, a thin film is exposed to form a test region 180. A plurality of test regions 180 can be formed. In the illustrated embodiment, for convenience of the description, a first test region 181 and a second test region 182 are formed. The dummy pixel 13 is formed under the same conditions as a thin film formed on the first region 11, and can determine a cause of defects in the thin film formed on the first region 11 from the second region 12, for example, through an optical analysis of a thin film in the test region 180 based on set device characteristics data, for example, surface roughness of the thin film, uniformity of a thickness of the thin film, content of impurities, the uniformity in a density of a layer, and the like.

Figure 2:
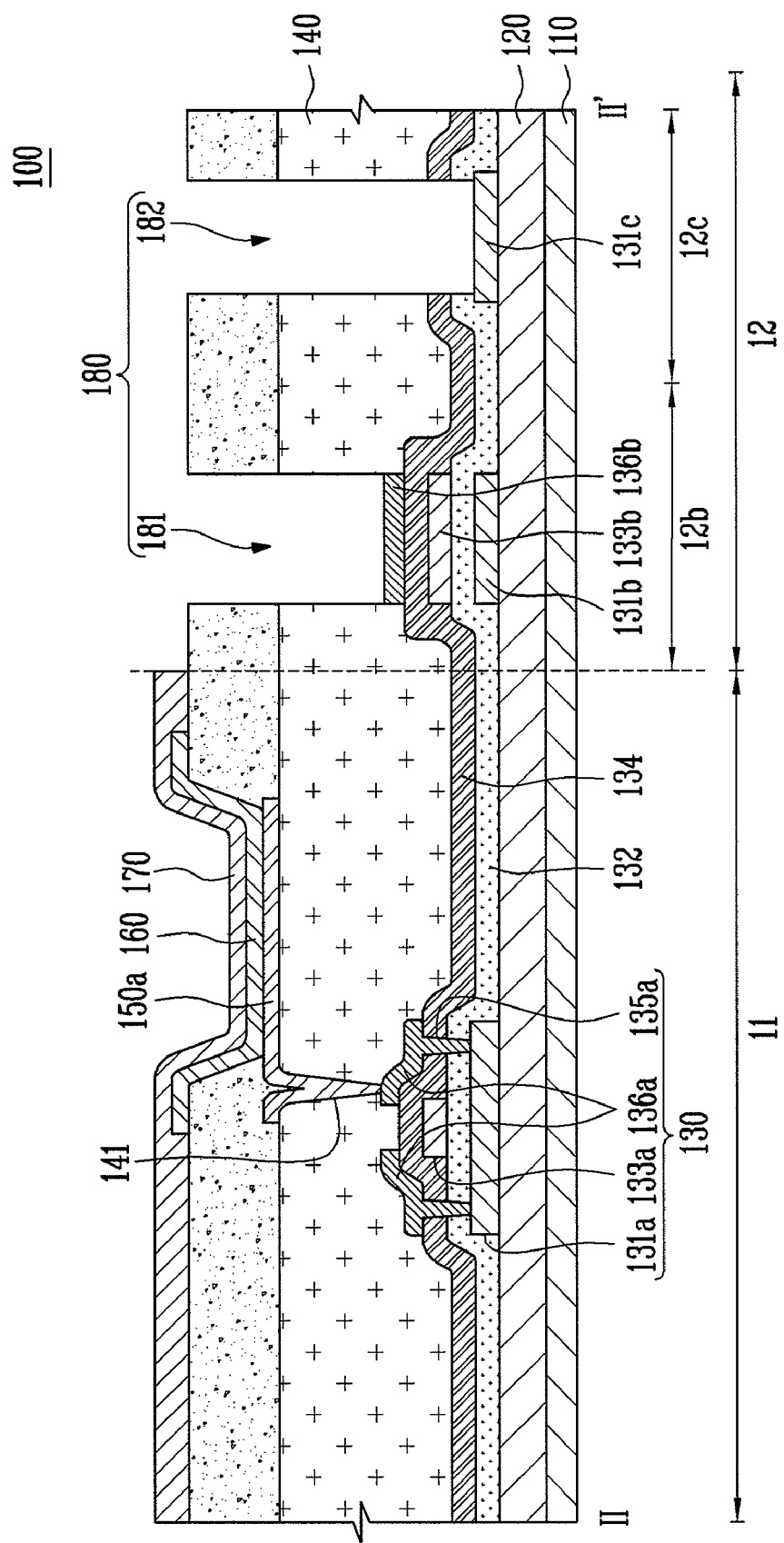
FIG. 2 is a cross-sectional view of the organic light emitting display taken along section I-I' of FIG. 1.

FIG. 2 is a cross-sectional view of the organic light emitting display 100 taken along section I-I' of FIG. 1. Referring to FIG. 2, the illustrated organic light emitting display 100 includes a substrate 110, a thin film transistor 130, and an organic light emitting diode.

The thin film transistor 130 is formed on the first region 11 of the substrate 110, and includes a semiconductor layer 131a, a gate electrode 133a, and source/drain electrodes 136a. The organic light emitting diode is electrically coupled to the thin film transistor 130, and includes a first electrode 150a, an emission layer 160, and a second electrode 170. The organic light emitting display 100 further includes a dummy pixel 13 shown in FIG. 1. The dummy pixel 13 is formed on the second region 12 of the substrate 110, and includes at least one dummy pattern, which is formed of the same material as one of the semiconductor layer 130a, the gate electrode 133a, the source/drain electrodes 135a, and the first electrode 150a.

A buffer layer 120 is formed on a substrate 110. The buffer layer 120 can be formed of a nitride layer or an oxide layer. A thin film transistor 130 is formed on the buffer layer 120. The thin film transistor 130 includes a semiconductor layer 131a, a gate electrode 133a, and source/drain electrodes 135a.

The semiconductor layer 131a is formed on the buffer layer 120 in the first region 11. A first dummy semiconductor layer 131b is formed on the buffer layer 120 in a second region 12b of the non-pixel region 12. A second dummy semiconductor layer 131c is formed on a third region 12c of the non-pixel region 12. A gate insulating layer 132 is formed on the buffer layer 120 on which the semiconductor layer 131a, the first dummy semiconductor layer 131b, and the second dummy semiconductor layer 131c are formed.

A gate electrode 133a is formed on the gate insulating layer 132. A dummy gate electrode 133b is formed on the gate insulating layer 132 corresponding to the first dummy semiconductor layer 131b. Here, a mask is formed over the third region 12c to prevent depositing gate electrode materials over the second dummy semiconductor layer 131c.

An interlayer dielectric layer 134 is formed on an entire surface of the gate insulating layer 132, the gate electrode 133a, and the dummy gate electrode 133b. A part of the gate insulating layer 132 and a part of the interlayer dielectric layer 134 are etched to form contact holes 135a in the first region exposing source/drain regions. A test region 182 is formed in the third region 12c by exposing the second dummy semiconductor layer 131c. Here, since the second dummy semiconductor layer 131c has the etch ratio greater than that of the gate insulating layer 132 and the interlayer dielectric layer 134, it is not damaged or etched.

The third region 12c in which the test region 182 is formed is masked. Source/drain electrodes 136a are formed on the first region 11 of the interlayer dielectric layer 134 through the contact holes 135a to electrically couple to the source/drain regions of the semiconductor layer 131a. And, dummy source/drain electrodes 136b are formed on the interlayer dielectric layer 134 of the second region 12b. Next, the mask on the third region 12c is removed. As discussed earlier, the third region 12c was masked to prevent it from being coated with source/drain materials.

A planarization layer 140 is formed on an entire surface of the interlayer dielectric layer 134 on which the source/drain electrodes 136a and the dummy source/drain electrodes 136b are formed. Further, a part of the planarization layer 140 is etched to form a via hole in the first region 11. A first test region 181 exposing the dummy gate electrode 136b is formed in the second region 12b. A second test region 182 exposing the second dummy semiconductor layer 131c is formed in the third region 12c. Here, because a etch ratio of the source/drain electrodes 136a, the dummy source/drain electrodes 135b, and the second dummy semiconductor layer 131c is greater than that of the planarization layer 140, they are not damaged or etched.

Subsequently, a mask is formed over the non-pixel region 12, and a first electrode layer 150a is formed in the via hole 141 and the planarization layer 140. Then, the mask is removed. The first electrode layer 150a is electrically coupled to one of the source/drain electrodes 136a of the thin film transistor 130 through the via hole 141.

Furthermore, a plurality of dummy patterns formed on the non-pixel region 12 may have the same shape as the semiconductor layer 131a, the gate electrode 133a, and source/drain electrodes 136a, or various other shapes selected by a user. Here, the plurality of dummy patterns include the first dummy semiconductor layer 131b, the second dummy semiconductor layer 131c, the dummy gate electrode 133b, and the dummy source/drain electrodes 136b.

A pixel defining layer is formed on an entire surface of the planarization layer 140 in which the first electrode layer 150a is formed. The pixel defining layer includes an opening that exposes a portion of the first electrode layer 150a. The opening is formed in the pixel defining layer. Simultaneously, the pixel defining layer formed on the dummy source/drain electrodes 136b and the dummy semiconductor layer 131c of the second region 12 is etched to expose the dummy source/drain electrodes 136b and the dummy semiconductor layer 131c to an exterior.

Next, a mask is formed on the non-pixel region 12, and an emission layer 160 and a second electrode layer 170 are formed on the first electrode layer 150a. The same thin film as formed in the pixel region 11 is formed in the non-pixel region 12 under the same conditions, so that the non-pixel region 12 provides a device for testing a thin film formed on the pixel region 11.

Meanwhile, the dummy pixel 13 includes a test region 180. Surface of thin films in the test region 180 are exposed through openings. The test region 180 includes a first test region 181 and a second test region 182. The first test region 181 exposes a surface of the dummy gate electrode 135b and sidewalls of the planarization layer 140 and the pixel defining layer. The second test region 182 exposes a surface of the second dummy semiconductor layer 131c, and sidewalls of the gate insulating layer 132, the interlayer dielectric layer 134, the planarization layer 140, and the pixel defining layer.

As described above, the test region 180 is formed in the dummy pixel 13 to optically analyze a thin film. That is, the optical analysis in a thin film exposed to the test region 180 may include the surface roughness of the thin film, the uniformity in a thickness of the thin film, content of impurities, the uniformity in a density of a layer, and the like.

FIG. 3 is a cross-sectional view showing an organic light emitting display 200 according to a second embodiment. Referring to FIG. 3, the organic light emitting display 200 according to the second embodiment includes a substrate 210, a thin film transistor 230, and an organic light emitting diode.

The thin film transistor 230 is formed on a first region 21 of the substrate 210, and includes a semiconductor layer 231a, a gate electrode 233a, and source/drain electrodes 235a. The organic light emitting diode is electrically coupled to the thin film transistor 230, and includes a first electrode 250a, an emission layer 260, and a second electrode 270. The organic light emitting display 200 further includes a dummy pixel 13, as shown in FIG. 1. The dummy pixel 13 is formed in a second region 22 of the substrate 210, and includes at least one dummy pattern, which is formed of the same material as one of the semiconductor layer 230a, the gate electrode 233a, the source/drain electrodes 235a, and the first electrode 250a.

To avoid a repetition of explanation, a detailed description of the structural elements identical to those shown in the first embodiment, namely, the thin film transistor 230, the planarization layer 240, the first electrode layer 250a, the emission layer 260, and the second electrode layer 270, is omitted.

The second embodiment is similar to the first embodiment. One difference is that the dummy pixel includes a dummy semiconductor layer 231b, a dummy gate electrode 233b, dummy source/drain electrodes 235b, and a first dummy electrode 250b.

A first electrode 250a is formed on the planarization layer 240 in a first region 21, and a first dummy electrode 250b is formed on the planarization layer 240 in a second region 22. A pixel defining layer is formed on an entire surface of the planarization layer 240 on which the first electrode 250a and the first dummy electrode 250b. A part of the pixel defining layer is etched to form an opening in the first region 21, and to form an opening, namely, a test region 280, in the second region 22 exposing the first dummy electrode 250b. As explained earlier, the test region 280 is formed in the dummy pixel. Here, in the test region 280, one surface of a thin film is exposed, so that an optical analysis of the exposed thin film may be performed, for example, to measure surface roughness of the thin film, the uniformity in a thickness of the thin film, content of impurities, the uniformity in a density of a layer, and the like. Further, when the test region 280 is formed in the second region 22, a mask is over the second region 22, and an emission layer 260 and a second electrode layer 270 are formed over the first electrode 250a in the first region 21.

FIG. 4 is a cross-sectional view showing an organic light emitting display 300 according to a third embodiment. Referring to FIG. 4, the organic light emitting display 300 according to the third embodiment includes a substrate 310, a thin film transistor 330, and an organic light emitting diode.

The thin film transistor 330 is formed on a first region 31 of the substrate 310, and includes a semiconductor layer 331a, a gate electrode 333a, and source/drain electrodes 335a. The organic light emitting diode is electrically coupled to the thin film transistor 330, and includes a first electrode 350a, an emission layer 360, and a second electrode 370. The organic light emitting display 300 further includes a dummy pixel 13, as shown in FIG. 1. The dummy pixel 13 is formed on a second region 32 of the substrate 310, and includes at least one dummy pattern, which is formed of the same material as one of the semiconductor layer 330a, the gate electrode 333a, the source/drain electrodes 335a, and the first electrode 350a.

To avoid a repetition of explanation, a detailed description of the structural elements identical to those shown in the first embodiment, namely, the thin film transistor 330, the planarization layer 340, the first electrode layer 350a, the emission layer 360, and the second electrode layer 370, is omitted.

The third embodiment is similar to the first embodiment. One difference is that a first dummy electrode 350b is formed in contact with the dummy source/drain electrodes 335b in the dummy pixel.

A planarization layer 340 is formed on the interlayer dielectric layer 334 including the source/drain electrodes 335a and the dummy source/drain electrodes 335b. The planarization layer 340 is partially etched to form a via hole 341 in the first region 31, and to form an opening exposing the dummy gate electrode 335b in the second region 32. A first electrode 350a is formed in the via hole 341 and the planarization layer 340 of the first region 31, and a first dummy electrode 350b is formed on the dummy source/drain electrodes 335b.

As discussed above, a test region 380 is formed in the second region 32 to expose the first dummy electrode 350b. The test region 380 exposes a surface of the first dummy electrode 350b, and sidewalls of the planarization layer 340 and the pixel defining layer to the exterior.

As described above, an optical analysis in an exposed thin film of the test region 380 may be used to measure surface roughness of the exposed thin film, the uniformity in a thickness of the thin film, content of impurities, the uniformity in a density of a layer, and the like.

Furthermore, when the test region 380 is formed in the second region 32, a mask is formed above the first dummy electrode 350b, and the emission layer 360 and the second electrode layer 370 are formed on the first electrode 350a of the first region 21.

Figure 5:
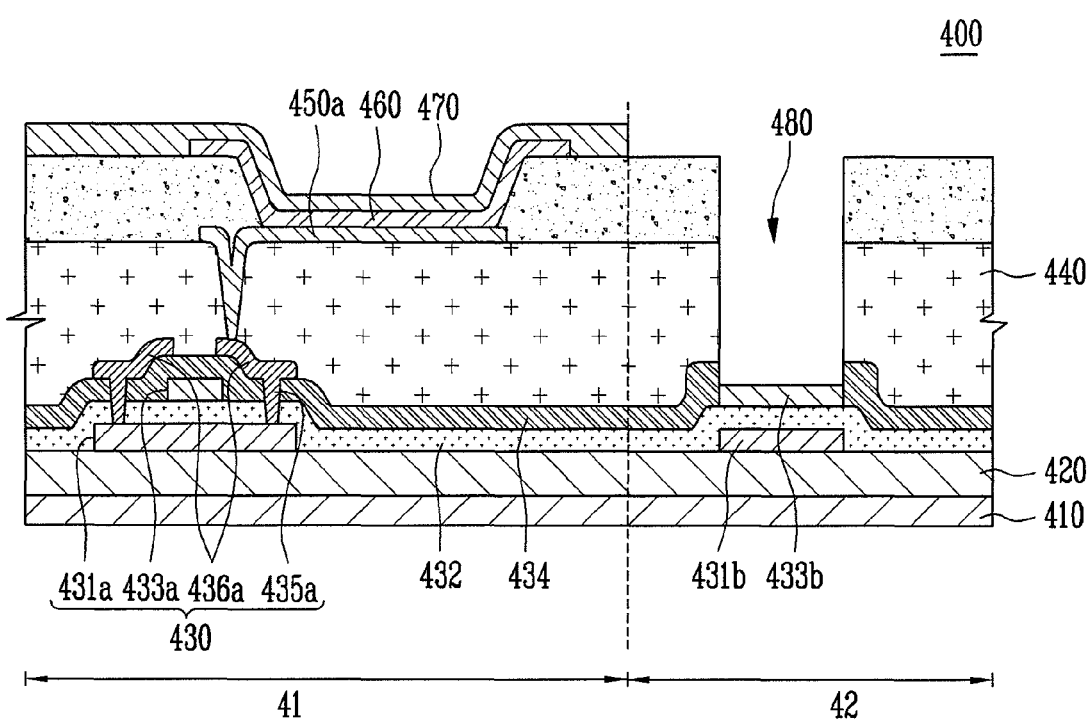
FIG. 5 is a cross-sectional view showing an organic light emitting display according to a fourth embodiment.

FIG. 5 is a cross-sectional view showing an organic light emitting display 400 according to a fourth embodiment. Referring to FIG. 5, the organic light emitting display 400 according to the fourth embodiment includes a substrate 410, a thin film transistor 430, and an organic light emitting diode.

The thin film transistor 430 is formed on a first region 41 of the substrate 410, and includes a semiconductor layer 431a, a gate electrode 433a, and source/drain electrodes 435a. The organic light emitting diode is electrically coupled to the thin film transistor 430, and includes a first electrode 450a, an emission layer 460, and a second electrode 470. The organic light emitting display 400 further includes a dummy pixel 13, as shown in FIG. 1. The dummy pixel 13 is formed on a second region 42 of the substrate 410, and includes at least one dummy pattern, which is formed of the same material as one of the semiconductor layer 430a, the gate electrode 433a, the source/drain electrodes 435a, and the first electrode 450a.

To avoid a repetition of explanation, a detailed description of the structural elements identical to those shown in the first embodiment, namely, the thin film transistor 430, the planarization layer 440, the first electrode layer 450a, the emission layer 460, and the second electrode layer 470, is omitted.

The fourth embodiment is similar to the second embodiment. One difference is that a dummy pixel includes a dummy semiconductor layer 431a and a dummy gate electrode 433b.

A gate insulating layer 432 and an interlayer dielectric layer 434 of the first region 41 are partially etched to form a contact hole 435a exposing source/drain regions. An interlayer dielectric layer 434 of the second region 42 is exposed to form a test region, which exposes a dummy gate electrode 433. The test region 480 exposes a surface of the dummy electrode 433b, and sidewalls of the planarization layer 440 and the pixel defining layer.

Here, in the test region 480, one surface of a thin film is exposed, so that an optical analysis thereof may be used to measure surface roughness of the thin film, the uniformity in a thickness of the thin film, content of impurities, the uniformity in a density of a layer, and the like. Furthermore, when the test region 480 is formed in the second region 42, a mask is formed over the second region 42, and an emission layer 260 and a second electrode layer 470 are formed over the first electrode 450a in the first region 41.

Although embodiments of an organic light emitting diode comprising a dummy pixel have been described herein, it would be appreciated by those skilled in the art that a substantially similar strategy is applicable to the manufacture and testing of a Liquid Crystal Display (LCD), a Field Emission Display (FED), a Plasma Display Panel (PDP), an Electro Luminescent Display (ELD), and a Vacuum Fluorescent Display (VFD).

Although certain exemplary embodiments have been shown and described, it would be appreciated by those skilled in the art that changes might be made in these embodiment without departing from the principles and spirit of the disclosure, the scope of which is defined in the claims and their equivalents.

What is claimed is:

1. A light emitting display device, comprising:
a substrate;
a thin film transistor formed on a first region of the substrate, and including a semiconductor layer, a gate electrode, and source/drain electrodes wherein the thin film transistor is covered by at least one layer;
an organic light emitting diode electrically coupled to the thin film transistor and including a first electrode, an emission layer, and a second electrode; and
a dummy pixel including at least one dummy pattern, wherein
the dummy pixel is formed in a second region of the substrate wherein the dummy pixel is different than the thin film transistor and includes a dummy pattern and one surface of the dummy pattern is exposed through the opening in the at least one layer, and
the at least one dummy pattern is formed of the same material as one of the semiconductor layer, the gate electrode, the source/drain electrodes, and the first electrode and wherein at least one opening is formed in the at least one layer so that one surface of the dummy pattern formed of the same material as one of the semiconductor layer, the gate electrode, the source/drain electrodes and the first electrode is exposed.

2. The light emitting display device as claimed in claim 1, wherein the exposed surface of the dummy pattern is formed of the same material as the semiconductor layer.

3. The light emitting display device as claimed in claim 1, wherein the exposed surface of the dummy pattern is formed of the same material as the gate electrode.

4. The light emitting display device as claimed in claim 1, wherein the exposed surface of the dummy pattern is formed of the same material as the source/drain electrodes.

5. The light emitting display device as claimed in claim 1, wherein the exposed surface of the dummy pattern is formed of the same material as the first electrode.

6. The light emitting display device as claimed in claim 1, comprising a plurality of dummy pixels, wherein one surface of each dummy pattern is exposed through a respective opening.

7. The light emitting display device as claimed in claim 1, wherein a test pattern is formed on a third region of the substrate, configured for testing an electrical characteristic of the thin film transistor.

* * * * *